(12) United States Patent
Yang

(10) Patent No.: US 12,315,789 B2
(45) Date of Patent: May 27, 2025

(54) WINDOW BALL GRID ARRAY (WBGA) PACKAGE AND METHOD FOR MANUFACTURING THE SAME

(71) Applicant: NANYA TECHNOLOGY CORPORATION, New Taipei (TW)

(72) Inventor: Wu-Der Yang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 210 days.

(21) Appl. No.: 18/204,555

(22) Filed: Jun. 1, 2023

(65) Prior Publication Data
US 2024/0047333 A1 Feb. 8, 2024

Related U.S. Application Data

(62) Division of application No. 17/879,125, filed on Aug. 2, 2022.

(51) Int. Cl.
*H01L 23/13* (2006.01)
*H01L 21/48* (2006.01)
(Continued)

(52) U.S. Cl.
CPC .... *H01L 23/49833* (2013.01); *H01L 21/4853* (2013.01); *H01L 23/13* (2013.01); *H01L 23/3128* (2013.01); *H01L 23/49816* (2013.01); *H01L 24/32* (2013.01); *H01L 24/33* (2013.01); *H01L 24/48* (2013.01); *H01L 24/73* (2013.01); *H01L 2224/3201* (2013.01); *H01L 2224/32058* (2013.01); *H01L 2224/32225* (2013.01); *H01L 2224/3303* (2013.01); *H01L 2224/33055* (2013.01); *H01L 2224/4824* (2013.01); *H01L 2224/48464* (2013.01);
(Continued)

(58) Field of Classification Search
CPC ........... H01L 23/49833; H01L 21/4853; H01L 23/13; H01L 23/3128; H01L 23/49816; H01L 24/32; H01L 24/33; H01L 24/48; H01L 24/73; H01L 2224/3201; H01L 2224/32058; H01L 2224/32225; H01L 2224/3303; H01L 2224/33055; H01L 2224/4824; H01L 2224/48464; H01L 2224/73215; H01L 2924/15151; H01L 2924/15311; H01L 2924/182; H01L 21/56; H01L 24/92; H01L 21/50; H01L 22/32; H01L 23/481
See application file for complete search history.

(56) References Cited

U.S. PATENT DOCUMENTS

2009/0243064 A1* 10/2009 Camacho ............ H01L 23/4334
257/E23.116

FOREIGN PATENT DOCUMENTS

TW I764852 B 5/2022

OTHER PUBLICATIONS

Office Action dated on Sep. 23, 2023 related to Taiwanese Application No. 112102285.

* cited by examiner

*Primary Examiner* — Elias Ullah
(74) *Attorney, Agent, or Firm* — Xuan Zhang

(57) ABSTRACT

A WBGA package and a method of manufacturing a WBGA package are provided. The WBGA package includes a first substrate having a first through hole and a second substrate having a second through hole over the first through hole of the first substrate. The WBGA package also includes an electronic component having an active surface over the second through hole of the second substrate.

13 Claims, 13 Drawing Sheets

(51) Int. Cl.
*H01L 23/00* (2006.01)
*H01L 23/31* (2006.01)
*H01L 23/498* (2006.01)

(52) U.S. Cl.
CPC ............... *H01L 2224/73215* (2013.01); *H01L 2924/15151* (2013.01); *H01L 2924/15311* (2013.01); *H01L 2924/182* (2013.01)

WINDOW BALL GRID ARRAY (WBGA) PACKAGE AND METHOD FOR MANUFACTURING THE SAME

CROSS-REFERENCE TO RELATED APPLICATION

This application is a divisional application of U.S. Non-Provisional application Ser. No. 17/879,125 filed 2 Aug. 2022, which is incorporated herein by reference in its entirety.

TECHNICAL FIELD

The present disclosure relates to a window ball grid array (WBGA) package and a method for manufacturing a WBGA package, and more particularly, to a WBGA package having multiple substrates.

Discussion of the Background

In a window ball grid array (WBGA) package, a substrate may define a window over an electronic component. Probe test operations may be performed through the window to electrify test pads on the electronic component using probing needles to evaluate the electrical performance thereof and conduct failure analysis.

The electrical connections between the electronic component and the substrate may be accomplished by means of flip-chip bonding or wire bonding. Pad pitches of conductive pads on the electronic component vary depending on the different means of bonding.

Flip-chip connections are usually too time-consuming and costly to achieve an acceptable production throughput. Therefore, it is desirable to connect an electronic component, which is originally designed for flip-chip bonding, with a WBGA substrate through wire bonding.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a WBGA package. The WBGA package includes a first substrate having a first through hole and a second substrate having a second through hole over the first through hole of the first substrate. The WBGA package also includes an electronic component having an active surface over the second through hole of the second substrate.

Another aspect of the present disclosure provides a WBGA package. The WBGA package includes a first substrate having a first through hole and a second substrate having a second through hole over the first through hole of the first substrate. The WBGA package also includes a package body disposed in the first through hole of the first substrate and the second through hole of the second substrate. The package body is spaced apart from a sidewall of the second through hole of the second substrate.

In some embodiments, the package body covers the first conductive wire.

In some embodiments, the WBGA package further comprises: a second conductive wire extending through the second through hole of the second substrate.

In some embodiments, the WBGA package further comprises: a first adhesive layer disposed between the first substrate and the second substrate and covering the second conductive wire.

In some embodiments, the first adhesive layer contacts the sidewall of the second through hole of the second substrate.

In some embodiments, the WBGA package further comprises: a second adhesive layer disposed over the second substrate, wherein the first adhesive layer extends through the second through hole of the second substrate to contact the second adhesive layer.

Another aspect of the present disclosure provides a method of manufacturing a WBGA package. The method includes providing an electronic component having an active surface and disposing a first substrate having a first through hole over the active surface of the electronic component. The method also includes disposing a second substrate having a second through hole over the first through hole of the first substrate.

In some embodiments, the method further comprises: forming a first conductive wire extending through the first through hole of the first substrate and electrically connected with the first substrate and the electronic component.

In some embodiments, the method further comprises: disposing an adhesive layer in the first through hole of the first substrate and covering the first conductive wire.

In some embodiments, the method further comprises: forming a second conductive wire extending along a lateral surface of the second substrate and electrically connected with the first substrate and the second substrate.

In some embodiments, the method further comprises: disposing a package body in the first through hole of the first substrate and the second through hole of the second substrate.

In some embodiments, the method further comprises: forming an opening in the package body to expose the active surface of the electronic component.

According to some embodiments of the present disclosure, a substrate (such as an intermediate substrate) is utilized to electrically connect an electronic component, which is originally designed for flip-chip bonding, with a WBGA substrate through wire bonding. The electronic component can thus be encapsulated in a wire bonding WBGA package without redesigning the routing and the pad pitches thereof to adapt to the wire bonding WBGA package. The routing and the pad pitches of the circuitry of the electronic component can be more flexible.

In addition, the substrate can have a through hole (or a window) exposing a testing area, which may include a plurality of test pads. Probe test operations may be performed via the through hole to electrify the test pads on the electronic component using probing needles to evaluate the electrical performance thereof and conduct a failure analysis.

The foregoing has outlined rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1A:
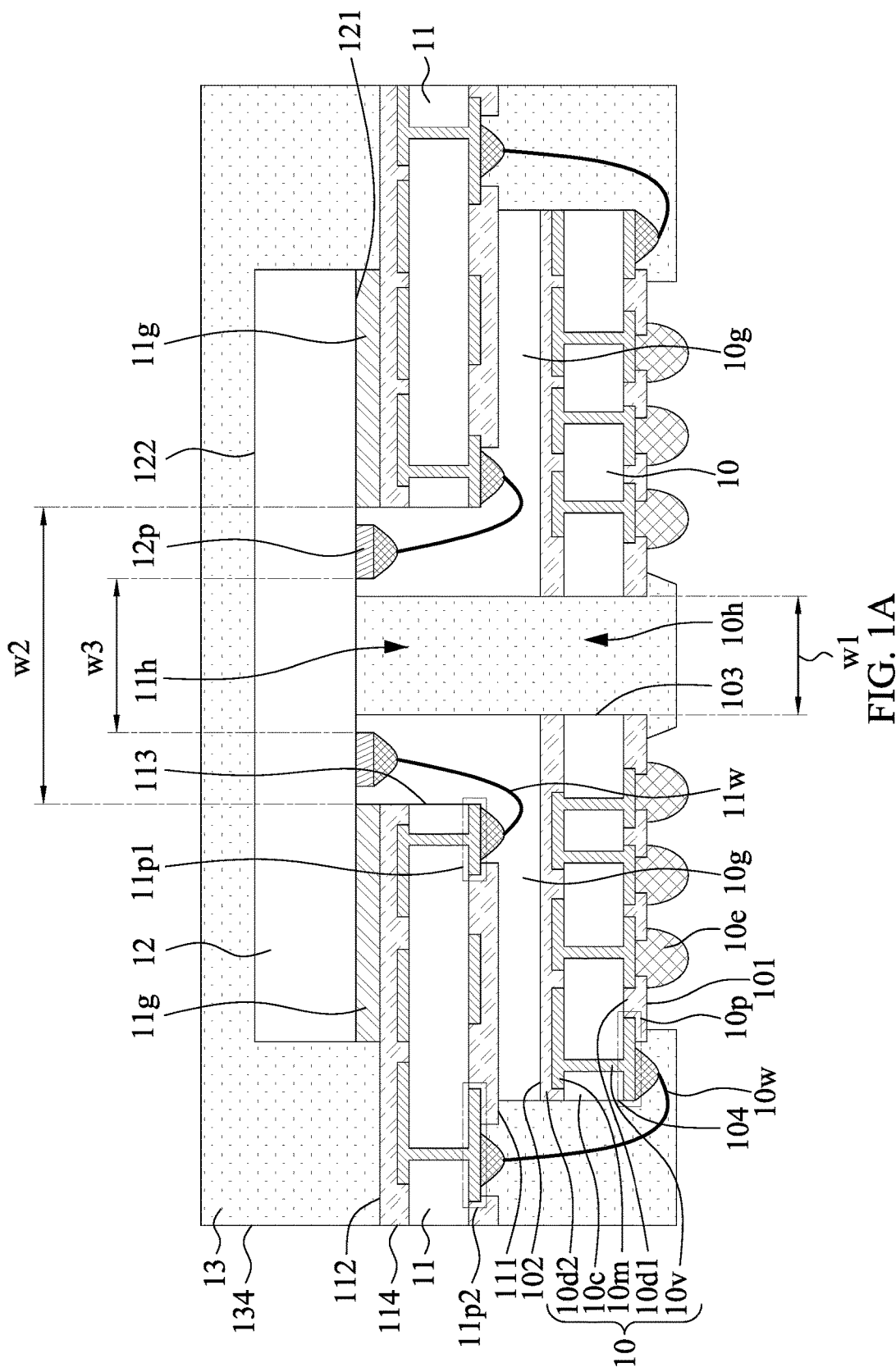
FIG. 1A is a schematic cross-sectional view of a WBGA package in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only, and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1A is a schematic cross-sectional view of a WBGA package 1 in accordance with some embodiments of the present disclosure. The WBGA package 1 may include a WBGA type chip package. As shown in FIG. 1, in some embodiments, the WBGA package 1 may include substrates 10, 11, an electronic component 12, and a package body 13.

In some embodiments, the substrate 10 may include semiconductor materials such as silicon, germanium, gallium, arsenic, and combinations thereof. In some embodiments, the substrate 10 may include plastic materials, ceramic materials or the like.

In some embodiments, the substrate 10 may include a core layer 10c and dielectric layers 10d1, 10d2 disposed on opposite sides of the core layer 10c. The substrate 10 may also include interconnections, circuitries or layout circuits, such as one or more vias and one or more conductive lines (or conductive traces) 10m.

The conductive lines 10m may be disposed over the core layer 10c. The vias 10v may include through vias penetrating or traversing through the core layer 10c to electrically connect the conductive lines 10m. A portion of the conductive lines 10m may be exposed from the dielectric layers 10d1 and 10d2, while another portion of the conductive lines 10m may be covered by the dielectric layers 10d1 and 10d2.

In some embodiments, the core layer 10c may include Prepreg (PP), Ajinomoto build-up film (ABF) or other suitable materials. In some embodiments, the vias 10v and the conductive lines 10m may each include conductive materials, such as metal or other suitable materials. For example, the vias 10v and the conductive lines 10m may each include copper (Cu), silver (Ag), aluminum (Al), gold (Au), or an alloy thereof. In some embodiments, the dielectric layers 10d1 and 10d2 may each include dielectric materials, such as solder resist or other suitable materials.

The substrate 10 may have a surface 101, a surface 102 opposite to the surface 101, and lateral surfaces 103, 104 extending between the surface 101 and surface 102. The lateral surface 103 may be opposite to the lateral surface 104.

In some embodiments, the substrate 10 may include or define a through hole 10h penetrating or traversing through the substrate 10. The through hole 10h may extend between the surface 101 and the surface 102. The through hole 10h may include a window opening, an opening, or a slot provided at the center of the substrate 10. In some embodiments, the lateral surface 103 may be a sidewall of the through hole 10h. In some embodiments, a width "w1" of the through hole 10h may be about 1200 µm.

The exposed portion of the conductive lines 10m may include conductive pads for providing electrical connections between the substrate 10 and the substrate 11 and electrical connections between the substrate 10 and an external electronic component (not shown).

For example, a conductive pad 10p may be defined on the surface 101 of the substrate 10. From a cross-sectional view, the conductive pad 10p may be adjacent to the lateral surface 104. The conductive pad 10p may be closer to the lateral surface 104 than to the lateral surface 103. The conductive pad 10p may be on a periphery of the substrate 10. The conductive pad 10p may be electrically connected with the substrate 11 through a conductive wire 10w.

The conductive wire 10w may extend along the lateral surface 104 of the substrate 10. The conductive wire 10w may be outside of the through hole 10h. The conductive wire 10w may be covered or encapsulated by the package body 13.

The conductive pad 10p may also be electrically connected with an input/output (I/O) terminal pad (such as a ball pad) on the surface 101 of the substrate 10 by the interconnections of the substrate 10.

For example, I/O terminal pads (such as ball pads) may be defined on the surface 101 of the substrate 10. One or more electrical contacts 10e may be disposed over the I/O terminal pads. The I/O terminal pads may be closer to the through hole 10h in comparison with the conductive pad 10p of the substrate 10.

The electrical contact 10e may be electrically connected to an underlying printed circuit board (PCB) (not shown) to provide electrical connections, for example, I/O connections, of the substrate 10. For example, the electrical contact 10e may include or be electrically connected to a ground reference node (GND) node, an electrical power node (VDD) node or a voltage node. In some embodiments, the electrical contact 10e may include a controlled collapse chip connection (C4) bump, a ball grid array (BGA) or a land grid array (LGA).

The substrate 11 may be disposed over the substrate 10. The substrate 11 may be disposed adjacent to the surface 102 of the substrate 10.

The substrate 11 may have a surface 111, a surface 112 opposite to the surface 111, and lateral surfaces 113, 114 extending between the surface 111 and surface 112. The lateral surface 113 may be opposite to the lateral surface 114. The lateral surface 113 of the substrate 11 may not be aligned with the lateral surface 103 of the substrate 10. The lateral surface 114 of the substrate 11 may not be aligned with the lateral surface 104 of the substrate 10.

In some embodiments, the substrate 11 may include or define a through hole 11h penetrating or traversing through the substrate 11. The through hole 11h may extend between the surface 111 and the surface 112. The through hole 11h may include a window opening, an opening, or a slot provided at the center of the substrate 11. In some embodiments, the lateral surface 113 may be a sidewall of the through hole 11h.

In some embodiments, a width "w2" of the through hole 11h may be greater than about 1200 µm. The width w2 of the through hole 11h may be greater than the width w1 of the through hole 10h.

In some embodiments, the through hole 11h and the through hole 10h may be partially overlapped. The substrate 10 may have an overhanging structure overlapped with the through hole 11h. The overhanging structure may extend or protrude into the through hole 11h from a top view.

A conductive pad 11p1 may be defined on the surface 111 of the substrate 11. From a cross-sectional view, the conductive pad 11p1 may be adjacent to the lateral surface 113. The conductive pad 11p1 may be closer to the lateral surface 113 than to the lateral surface 114. The conductive pad 11p1 may be adjacent to the through hole 11h. The conductive pad 11p1 may be electrically connected with the electronic component 12 through a conductive wire 11w.

The conductive wire 11w may extend along the lateral surface 113 of the substrate 11. The conductive wire 11w may extend through the through hole 11h.

A conductive pad 11p2 may be defined on the surface 111 of the substrate 11. From a cross-sectional view, the conductive pad 11p2 may be adjacent to the lateral surface 114. The conductive pad 11p2 may be closer to the lateral surface 114 than to the lateral surface 113. The conductive pad 11p2 may be on a periphery of the substrate 11. The conductive pad 11p2 may be electrically connected with the conductive pad 10p of the substrate 10 through the conductive wire 10w.

In some other embodiments, the substrate 11 may have two disconnected parts. For example, the left part of the substrate 11 and the right part of the substrate 11 may be physically separated.

The substrate 11 may be similar to the substrate 10. Therefore, some detailed descriptions may refer to the corresponding paragraphs above and are not repeated hereinafter for conciseness.

The electronic component 12 may be disposed over the surface 112 of the substrate 11. The electronic component 12 may cover an end of the through hole 11h. A central portion of the electronic component 12 may face or be exposed from the through hole 11h and the through hole 10h. In some embodiments, the central portion of the electronic component 12 may include a testing area. For example, one or more test pads (not illustrated in the figures) may be disposed over the central portion of the electronic component 12. For example, one or more test pads (not illustrated in the figures) may be exposed from the through hole 11h and the through hole 10h.

In some embodiments, the electronic component 12 may have a surface 121 facing the substrate 11 and a surface 122 facing away from the substrate 11. The surface 121 may include an active surface and the surface 122 may include a backside surface. One or more conductive pads 12p may be disposed over the surface 121 of the electronic component 12. In some embodiments, the testing area, which may include one or more test pads, may be disposed inside of the conductive pads 12p. For example, the conductive pads 12p may be disposed around the test pads.

In some embodiments, a pad pitch "w3" of the conductive pads 12p may be greater than about 1200 µm. The pad pitch w3 of the conductive pads 12p may be greater than the width w1 of the through hole 10h. The pad pitch w3 of the conductive pads 12p may be smaller than the width w2 of the through hole 11h.

In some embodiments, the electronic component 12 may include a semiconductor die or a chip, such as a memory die (e.g., dynamic random access memory (DRAM) die, static random access memory (SRAM) die, etc.), a signal processing die (e.g., digital signal processing (DSP) die), a logic die (e.g., application processor (AP), system-on-a-chip (SoC), central processing unit (CPU), graphics processing unit (GPU), microcontroller, etc.), a power management die (e.g., power management integrated circuit (PMIC) die), a radio frequency (RF) die, a sensor die, a micro-electromechanical-system (MEMS) die, a front-end die (e.g., analog front-end (AFE) dies) or other active components.

The substrate 11 may be attached to the surface 102 of the substrate 10 through an adhesive layer 10g. The adhesive layer 10g may be disposed between the substrate 11 and the substrate 10.

The adhesive layer 10g may cover or contact the surface 102 of the substrate 10. The adhesive layer 10g may cover or contact the surface 111 of the substrate 11. The adhesive layer 10g may be disposed over the conductive pad 11p1. The conductive pad 11p2 may be exposed from the adhesive layer 10g.

The adhesive layer 10g may be disposed in the through hole 11h. The adhesive layer 10g may cover or contact the lateral surface 113 of the substrate 11.

In some embodiments, a surface of the adhesive layer 10g may be substantially coplanar with the lateral surface 104 of the substrate In some embodiments, a surface of the adhesive layer 10g may be substantially coplanar with the lateral surface 103 of the substrate 10.

The electronic component 12 may be attached to the surface 112 of the substrate 11 through an adhesive layer 11g. The adhesive layer 11g may be adjacent to the through hole 11h. The adhesive layer 11g may surround the through hole 11h. In some embodiments, a surface of the adhesive layer 11g may be substantially coplanar with a sidewall (such as the lateral surface 113) of the through hole 11h. In some embodiments, a surface of the adhesive layer 11g may be substantially coplanar with a lateral surface of the electronic component 12.

In some embodiments, the adhesive layer 10g may extend through the through hole 11h to contact the adhesive layer 11g. In some embodiments, the conductive wires 11w may be covered or encapsulated by the adhesive layer 10g. In some embodiments, the adhesive layer 10g may be disposed over the conductive pads 12p. In some embodiments, the conductive pads 12p may be covered or encapsulated by the adhesive layer 10g.

In some embodiments, the adhesive layers 10g and 11g may each include an adhesive material, such as epoxy, a die attach film (DAF), glue or the like. In some embodiments, the adhesive layers 10g and 11g may include the same material. In some embodiments, the adhesive layers 10g and 11g may include different materials.

The package body 13 may be disposed over, cover or contact a part of the surface 101 of the substrate 10. For example, the package body 13 may be disposed over the conductive pad 10p. The electrical contacts 10e may be exposed from the package body 13.

The package body 13 may be disposed in the through hole 10h and the through hole 11h. The package body 13 may fill up the through hole 10h and the through hole 11h.

The package body 13 may cover or contact the sidewall (such as the lateral surface 103) of the through hole 10h. The package body 13 may be spaced apart from the sidewall (such as the lateral surface 113) of the through hole 11h by the adhesive layer 10g. For example, the package body 13 may be separated from the sidewall (such as the lateral surface 113) of the through hole 11h by the adhesive layer 10g. For example, the package body 13 may be separated from the conductive wire 11w by the adhesive layer 10g.

The package body 13 may cover or contact the lateral surface 104 of the substrate 10. In some embodiments, a lateral surface 134 of the package body 13 may be substantially coplanar with the lateral surface 114 of the substrate 11.

In some embodiments, the package body 13 may include molding material, such as a Novolac-based resin, an epoxy-based resin, a silicone-based resin, or another suitable encapsulant. Suitable fillers may also be included, such as powdered $SiO_2$.

As stated, the width w1 of the through hole 10h of the substrate may be about 1200 μm. Therefore, an electronic component having a pad pitch greater than about 1200 μm cannot directly be connected to the substrate 10 through wire-bonding. For example, an electronic component which is originally designed for flip-chip bonding cannot directly be connected to the substrate 10 through wire-bonding.

According to some embodiments of the present disclosure, by using the substrate (such as an intermediate substrate) 11, the electronic component 12 can be electrically connected to the substrate 10 through wire bonding. Therefore, the electronic component 12 can be encapsulated in a wire bonding WBGA package without redesigning the routing and the pad pitches thereof to adapt to the wire bonding WBGA package. The routing and the pad pitches of the circuitry of the electronic component 12 can be more flexible.

In addition, the substrate 11 has the through hole 11h exposing a testing area (and test pads thereon) of the electronic component 12. Probe test operations may be performed through the through hole 11h to electrify the test pads on the electronic component 12 using probing needles to evaluate the electrical performance thereof and conduct a failure analysis.

Figure 1B:
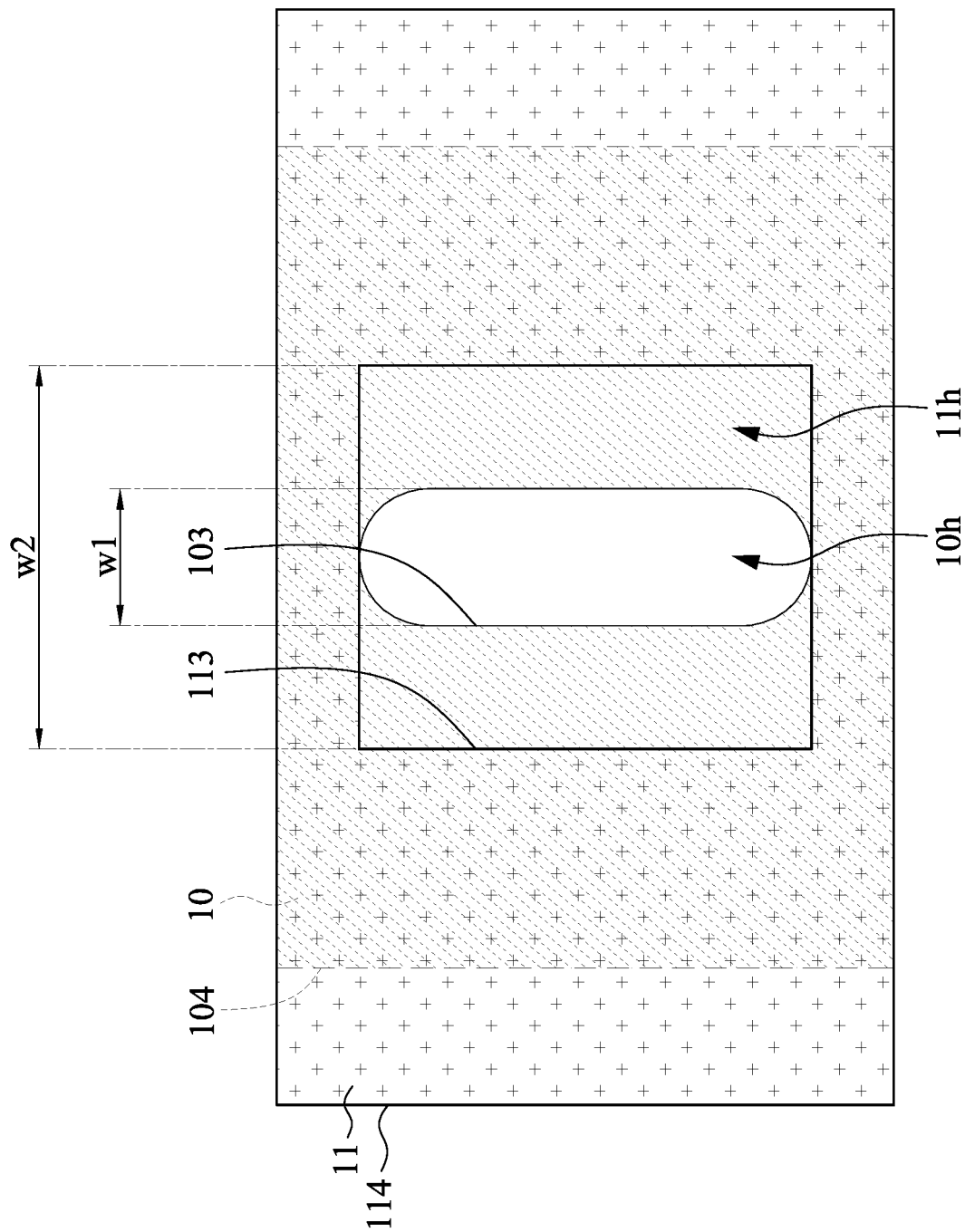
FIG. 1B is a top view of a part of a WBGA package in accordance with some embodiments of the present disclosure.

FIG. 1B is a top view of a part of a WBGA package in accordance with some embodiments of the present disclosure. In some embodiments, the WBGA package 1 in FIG. 1A may have a top view shown in FIG. 1B.

The width w1 of the through hole 10h of the substrate 10 may be about 1200 μm. In some embodiments, the width w2 of the through hole 11h of the substrate 11 may be greater than about 1200 μm. The width w2 of the through hole 11h of the substrate 11 may be greater than the width w1 of the through hole 10h of the substrate 10.

The substrate 10 may have an overhanging structure overlapped with the through hole 11h of the substrate 11. The overhanging structure may extend or protrude into the through hole 11h of the substrate 11 from a top view.

In some embodiments, a length of the through hole 11h of the substrate 11 and a length of the through hole 10h of the substrate 10 may be substantially equal.

In some embodiments, the through hole 10h of the substrate 10 may have an oval, an ellipse, or a circle-like shape. In some embodiments, the through hole 10h of the substrate 10 may have a curved surface. In some embodiments, the through hole 11h of the substrate 11 may have a rectangular shape. In some embodiments, the through hole 11h of the substrate 11 may have right angles.

In some other embodiments, the through hole 10h of the substrate 10 and the through hole 11h of the substrate 11 may have shapes, widths, and lengths different from the above descriptions and can be adjusted based on design requirements.

FIGS. 2A, 2B, 2C, 2D, 2E, 2F, 2G, 2H, 2I, and 2J illustrate stages of a method of manufacturing a WBGA package in accordance with some embodiments of the present disclosure. At least some of these figures have been simplified for a better understanding of the aspects of the present disclosure. In some embodiments, the WBGA package 1 in FIG. 1A may be manufactured by the operations described below with respect to FIGS. 2A, 2B, 2C, 2D, 2E, 2F, 2G, 2H, 2I, and 2J.

Figure 2A:
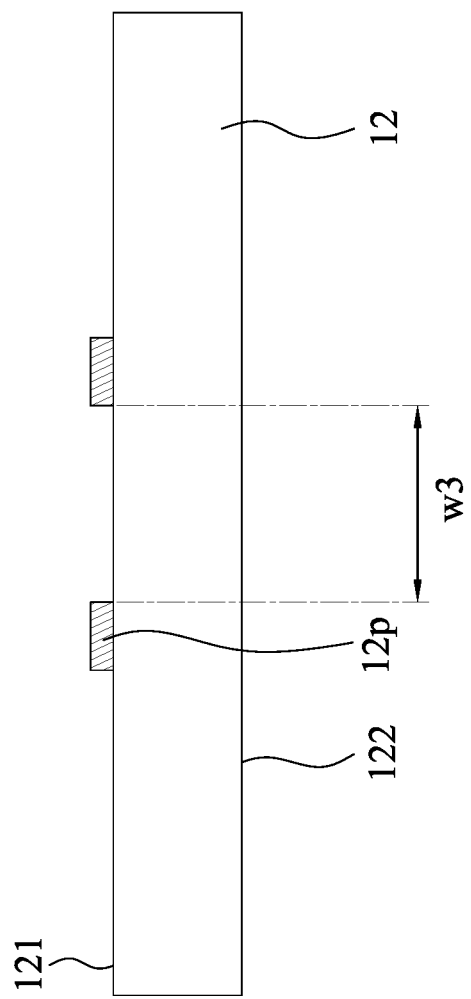
FIG. 2A illustrates one or more stages of a method of manufacturing a WBGA package in accordance with some embodiments of the present disclosure.

Referring to FIG. 2A, an electronic component 12 is provided. The electronic component 12 may have a surface 121 and a surface 122. The surface 121 may include an active surface and the surface 122 may include a backside surface. One or more conductive pads 12p may be disposed over the surface 121 of the electronic component 12. In some embodiments, the testing area, which may include one or more test pads, may be disposed inside of the conductive pads 12p. For example, the conductive pads 12p may be disposed around the test pads.

Figure 2B:
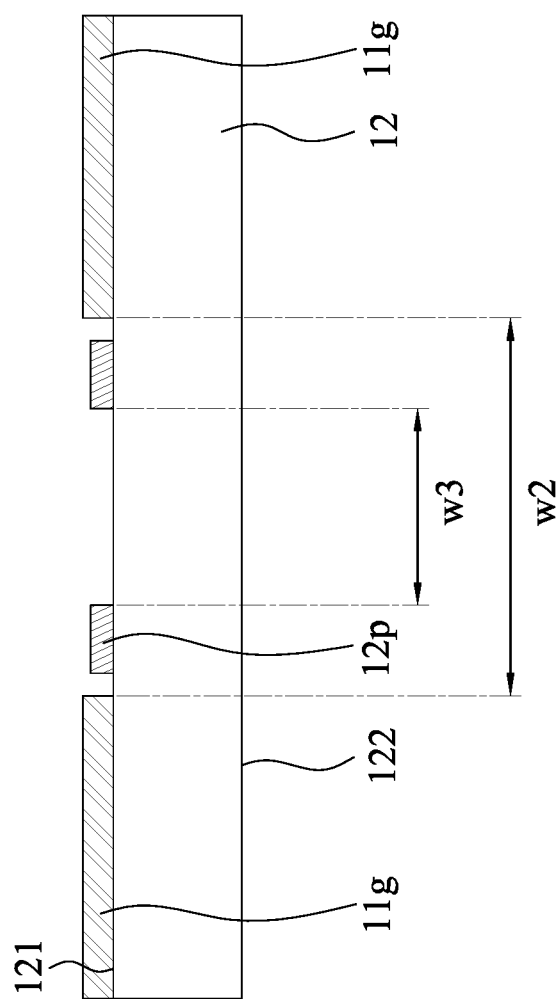
FIG. 2B illustrates one or more stages of a method of manufacturing a WBGA package in accordance with some embodiments of the present disclosure.

Referring to FIG. 2B, an adhesive layer 11g is disposed over the surface 121 of the electronic component 12. The adhesive layer 11g may be disposed around the conductive pads 12p. The adhesive layer 11g may be at the periphery of the electronic component 12.

Figure 2C:
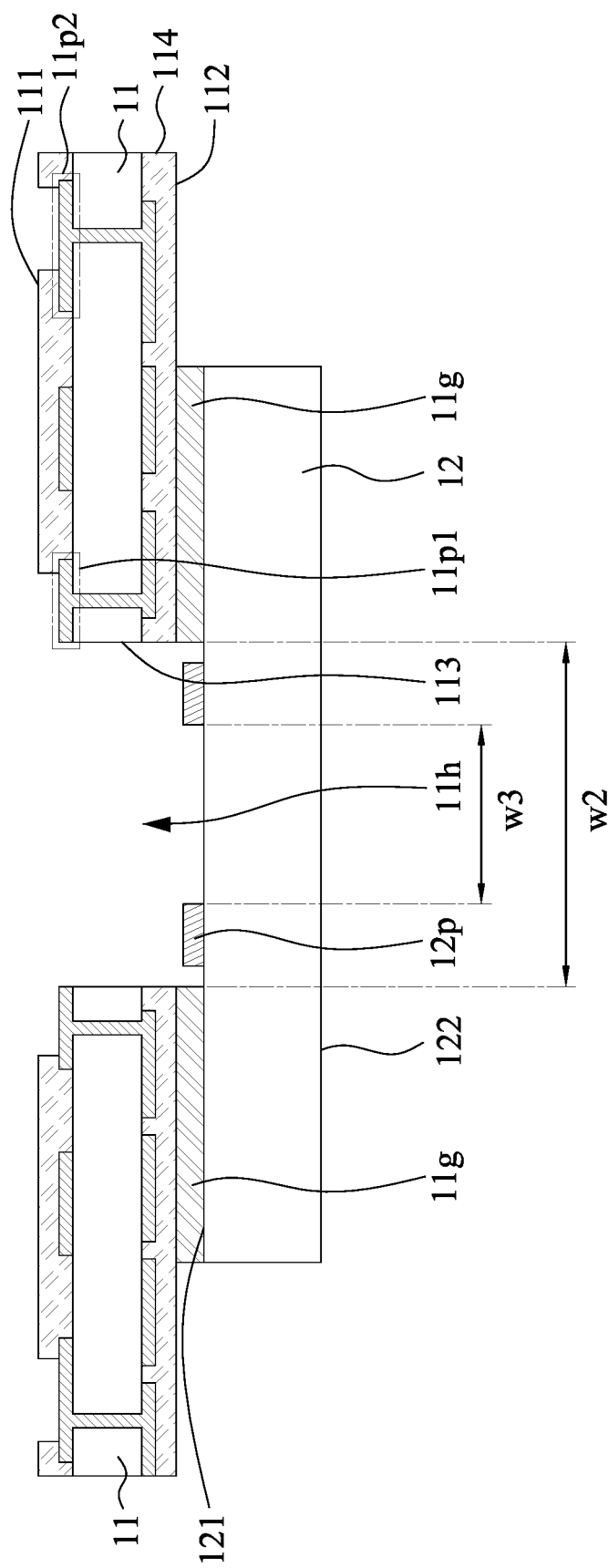
FIG. 2C illustrates one or more stages of a method of manufacturing a WBGA package in accordance with some embodiments of the present disclosure.

Referring to FIG. 2C, a substrate 11 is disposed over the surface 121 of the electronic component 12 through the adhesive layer 11g. The substrate 11 may have a surface 111, a surface 112 opposite to the surface 111, and lateral surfaces 113, 114 extending between the surface 111 and surface 112. The lateral surface 113 may be opposite to the lateral surface 114. The surface 112 may contact the adhesive layer 11g.

The substrate 11 may include or define a through hole 11h penetrating or traversing through the substrate 11. The through hole 11h may extend between the surface 111 and the surface 112. The conductive pads 12p may be exposed from the through hole 11h. The testing area may be exposed from the through hole 11h.

The substrate 11 may include conductive pads 11p1 and 11p2 on the surface 111 of the substrate 11. From a cross-sectional view, the conductive pad 11p1 may be adjacent to the lateral surface 113 and the conductive pad 11p2 may be adjacent to the lateral surface 114.

In some other embodiments, the substrate 11 may have two disconnected parts. For example, the left part of the substrate 11 and the right part of the substrate 11 may be physically separated. The two disconnected parts may be separated from each other by the through hole 11h. The two disconnected parts may be simultaneously or sequentially disposed over the surface 121 of the electronic component 12.

Figure 2D:
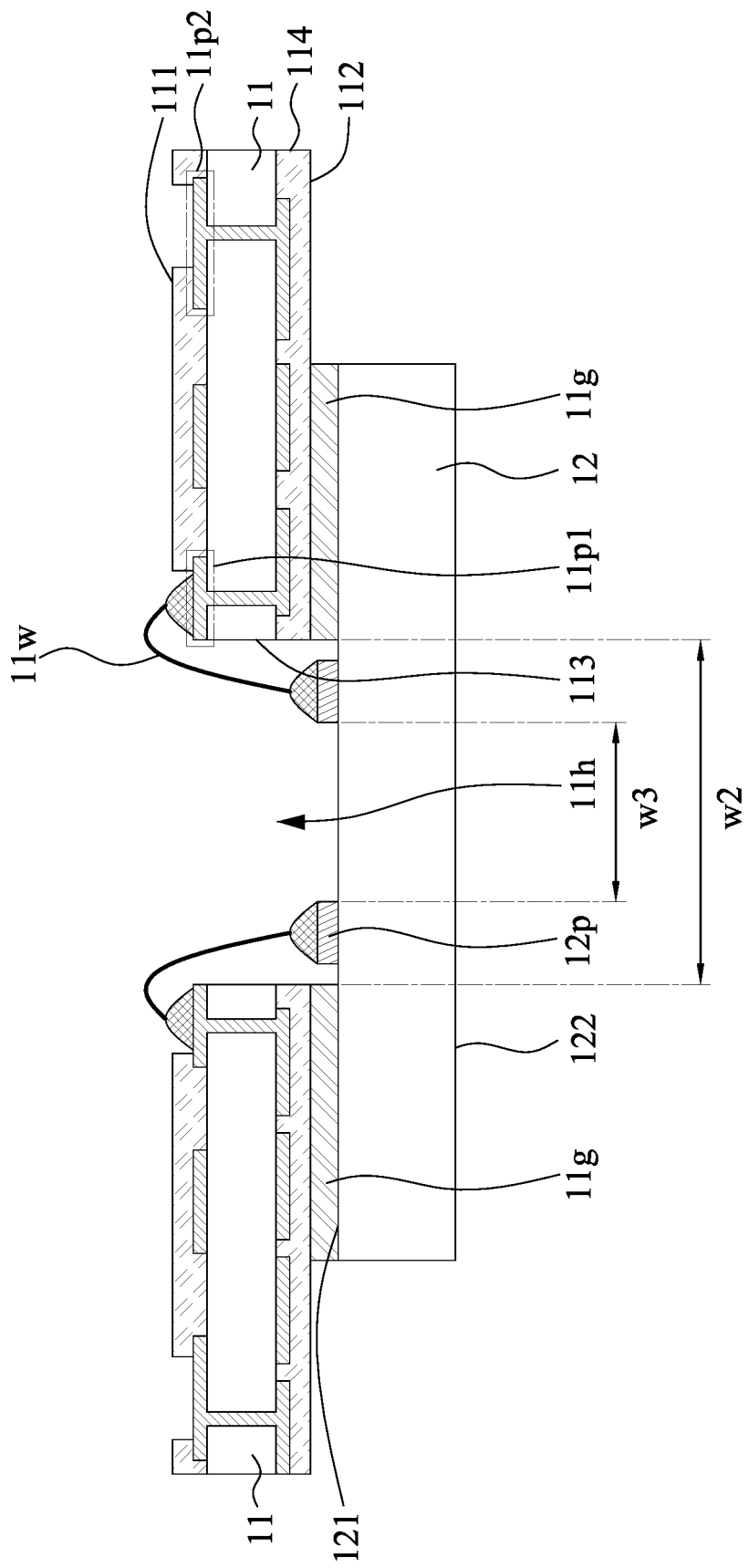
FIG. 2D illustrates one or more stages of a method of manufacturing a WBGA package in accordance with some embodiments of the present disclosure.

Referring to FIG. 2D, the conductive pad 11p1 and the conductive pad 12p are electrically connected through a conductive wire 11w. The conductive wire 11w may extend along the lateral surface 113 of the substrate 11. The conductive wire 11w may extend through the through hole 11h.

The number of the conductive wires 11w is not limited thereto. For example, there may be another conductive wire formed to electrically connect the substrate 11 with the electronic component 12.

Figure 2E:
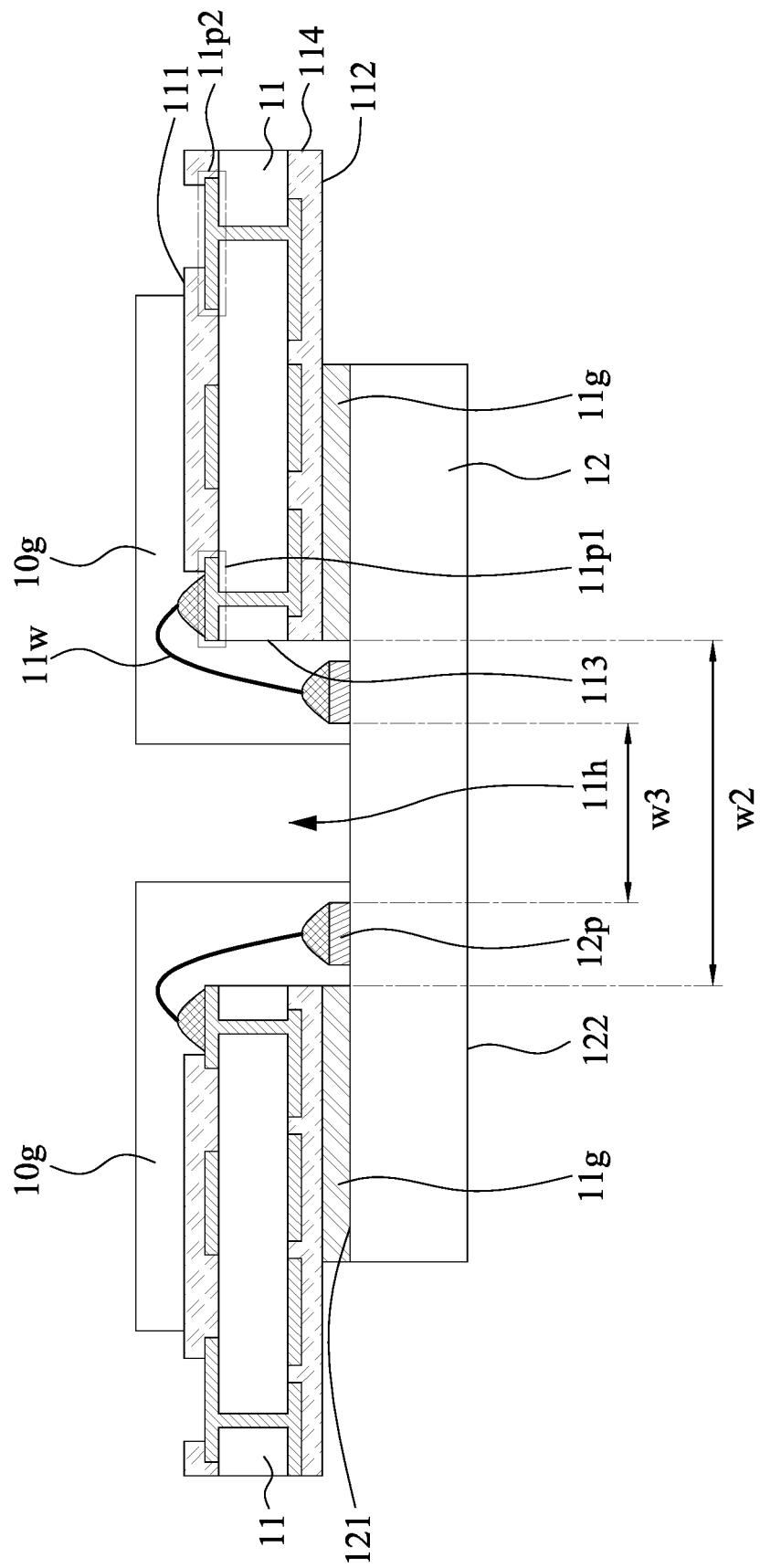
FIG. 2E illustrates one or more stages of a method of manufacturing a WBGA package in accordance with some embodiments of the present disclosure.

Referring to FIG. 2E, an adhesive layer 10g is disposed over the surface 111 of the substrate 11. The adhesive layer 10g may be disposed over the lateral surface 113 of the substrate 11. The adhesive layer 10g may be disposed in the through hole 11h. The adhesive layer 10g may encapsulate or cover the conductive wire 11w. The adhesive layer 10g may encapsulate or cover the conductive pad 12p on the electronic component 12. The testing area may be exposed from the adhesive layer 10g. The testing area may not be covered by the adhesive layer 10g.

Figure 2F:
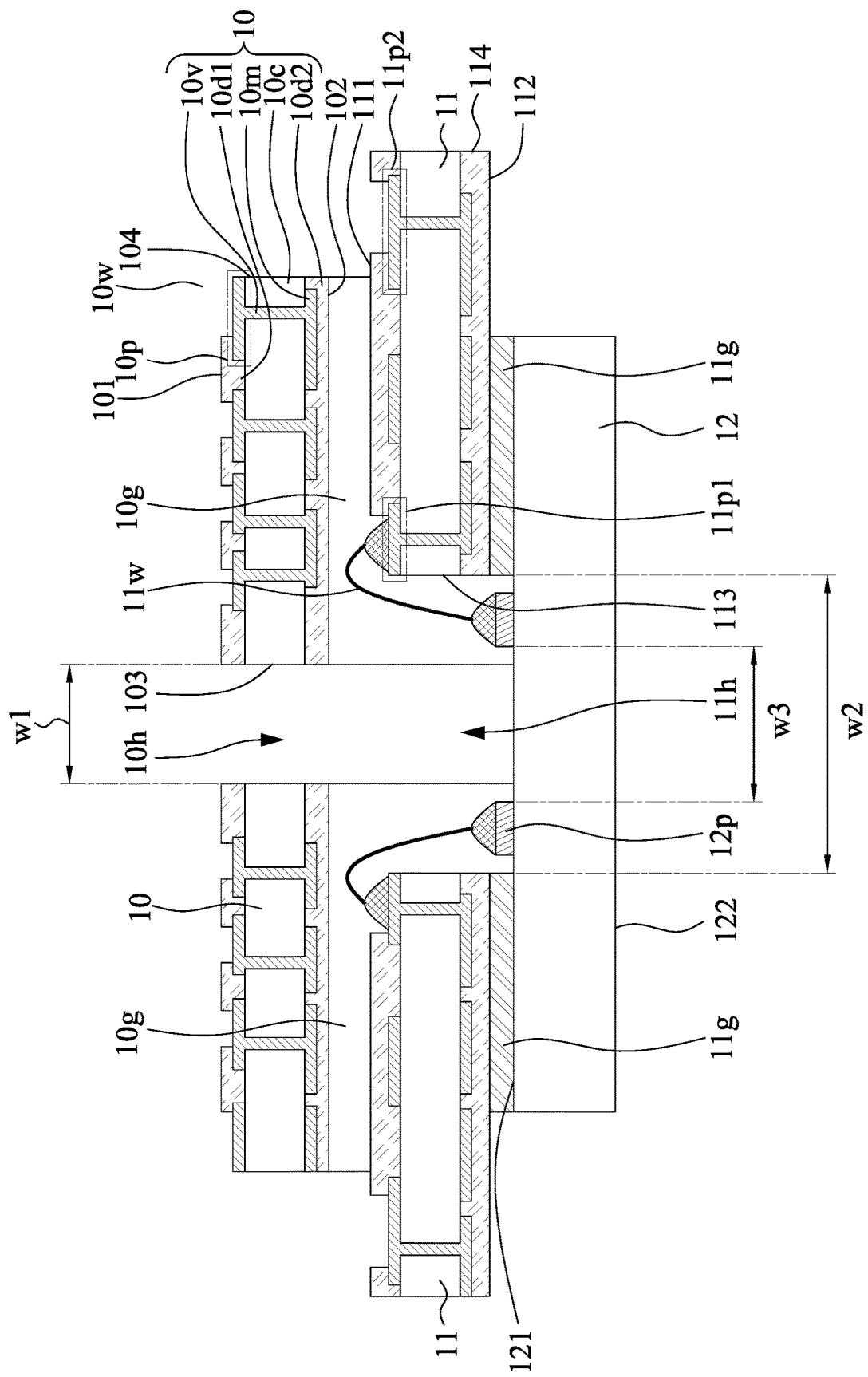
FIG. 2F illustrates one or more stages of a method of manufacturing a WBGA package in accordance with some embodiments of the present disclosure.

Referring to FIG. 2F, a substrate 10 is disposed over the surface 111 of the substrate 11 through the adhesive layer 10g. The substrate 10 may have a surface 101, a surface 102 opposite to the surface 101, and lateral surfaces 103, 104 extending between the surface 101 and surface 102. The lateral surface 103 may be opposite to the lateral surface 104. The surface 102 may contact the adhesive layer 10g.

In some embodiments, the substrate 10 may include or define a through hole 10h penetrating or traversing through the substrate 10. The through hole 10h may extend between the surface 101 and the surface 102. The through hole 10h may be at least partially overlapped with the through hole 11h. The testing area may be exposed from the through hole 10h. The testing area may not be covered by the substrate 10.

The substrate 10 may include a conductive pad 10p on the surface 101 of the substrate 10. From a cross-sectional view, the conductive pad 10p may be adjacent to the lateral surface 104.

Figure 2G:
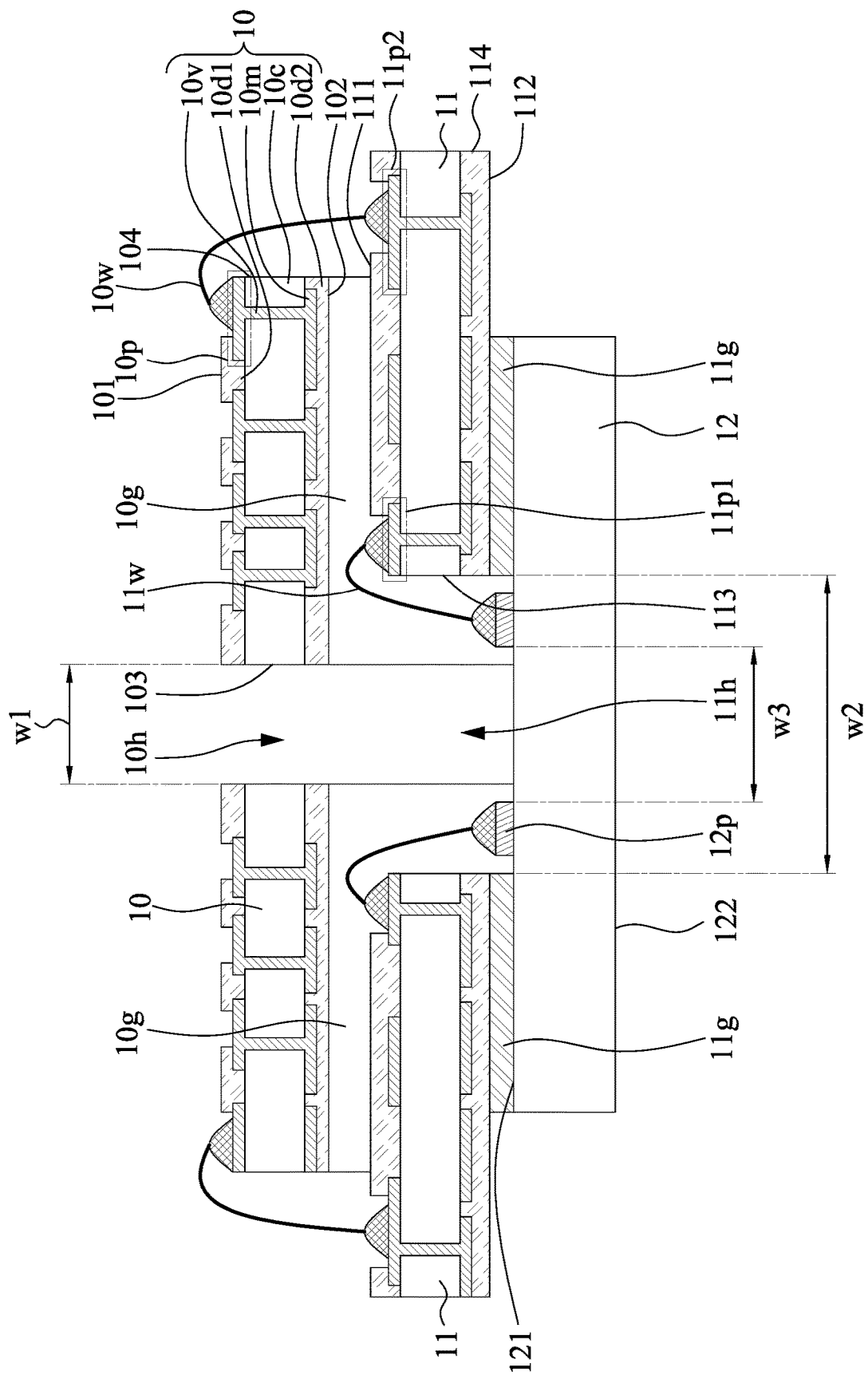
FIG. 2G illustrates one or more stages of a method of manufacturing a WBGA package in accordance with some embodiments of the present disclosure.

Referring to FIG. 2G, the conductive pad 11p2 and the conductive pad 10p are electrically connected through a conductive wire 10w. The conductive wire 10w may extend along the lateral surface 104 of the substrate 10.

The number of the conductive wires 10w is not limited thereto. For example, there may be another conductive wire formed to electrically connect the substrate 11 with the substrate 10.

Figure 2H:
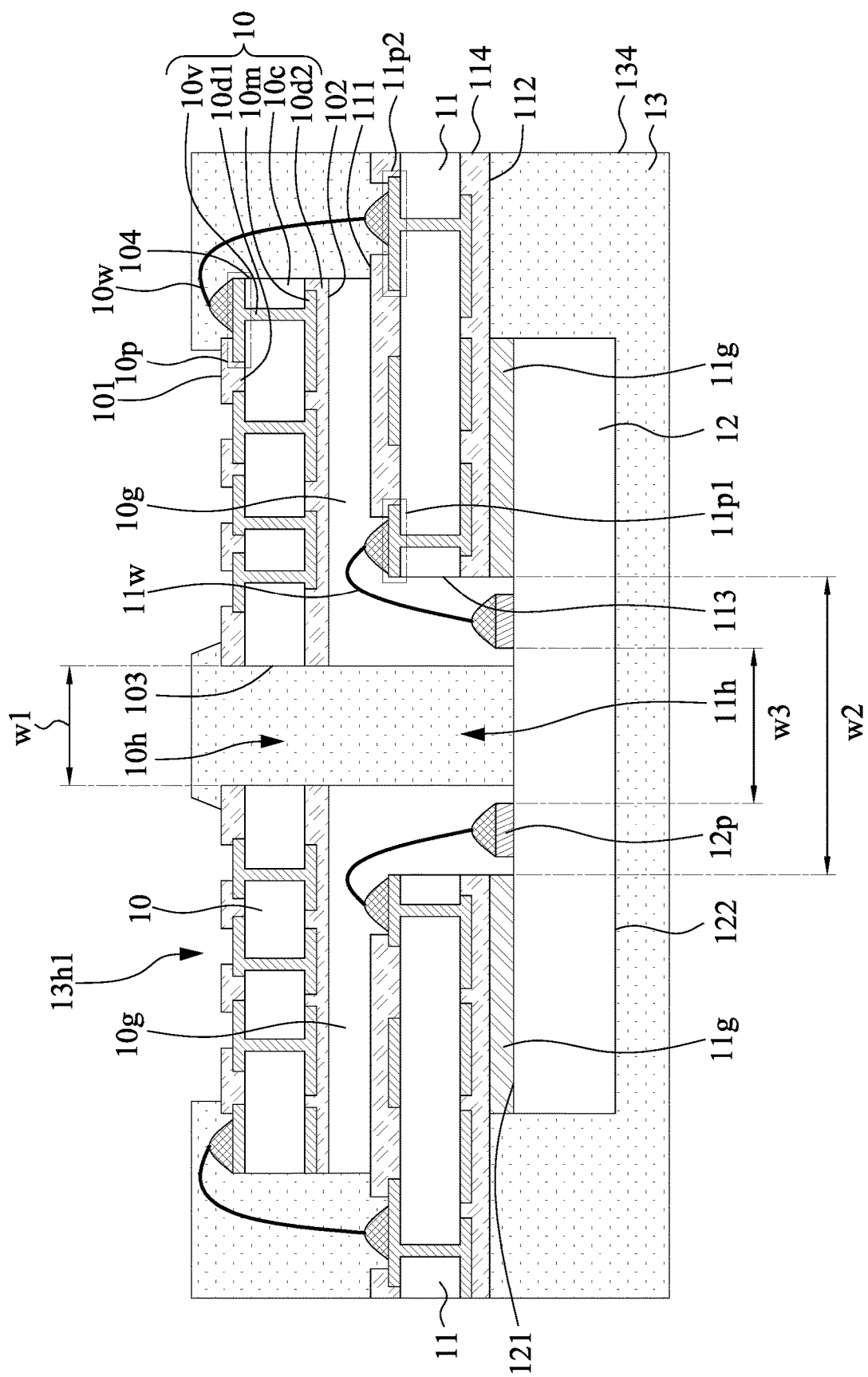
FIG. 2H illustrates one or more stages of a method of manufacturing a WBGA package in accordance with some embodiments of the present disclosure.

Referring to FIG. 2H, a package body 13 is disposed in the through hole 10h and the through hole 11h. The package body 13 may cover or encapsulate the conductive wire 10w. The package body 13 may cover or encapsulate the electronic component 12. In some embodiments, the package body 13 may be formed by a molding technique, such as transfer molding or compression molding.

A part of the package body 13 on the surface 101 of the substrate 10 may be removed to form an opening 13h1 to expose the I/O terminal pad (such as a ball pad) of the substrate 10.

Figure 2I:
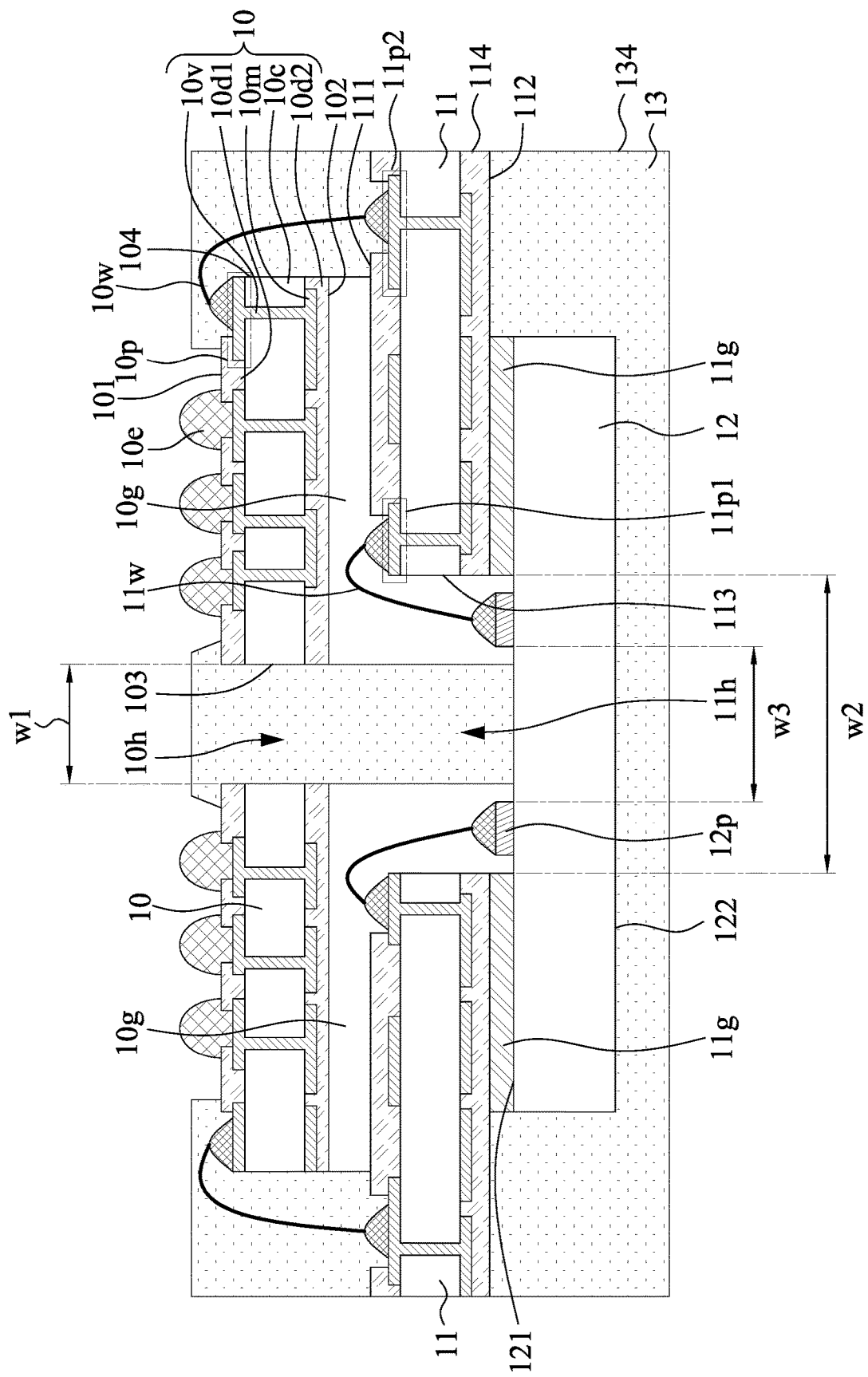
FIG. 2I illustrates one or more stages of a method of manufacturing a WBGA package in accordance with some embodiments of the present disclosure.

Referring to FIG. 2I, one or more electrical contacts 10e may be disposed over the I/O terminal pad of the substrate 10. The electrical contact 10e may be electrically connected to an underlying PCB (not shown) to provide electrical connections, for example, I/O connections, of the substrate 10. For example, the electrical contact 10e may include or be electrically connected to a GND node, a VDD node or a voltage node. In some embodiments, the operation of forming the electrical contact 10e may be conducted before the operation of forming the package body 13.

Figure 2J:
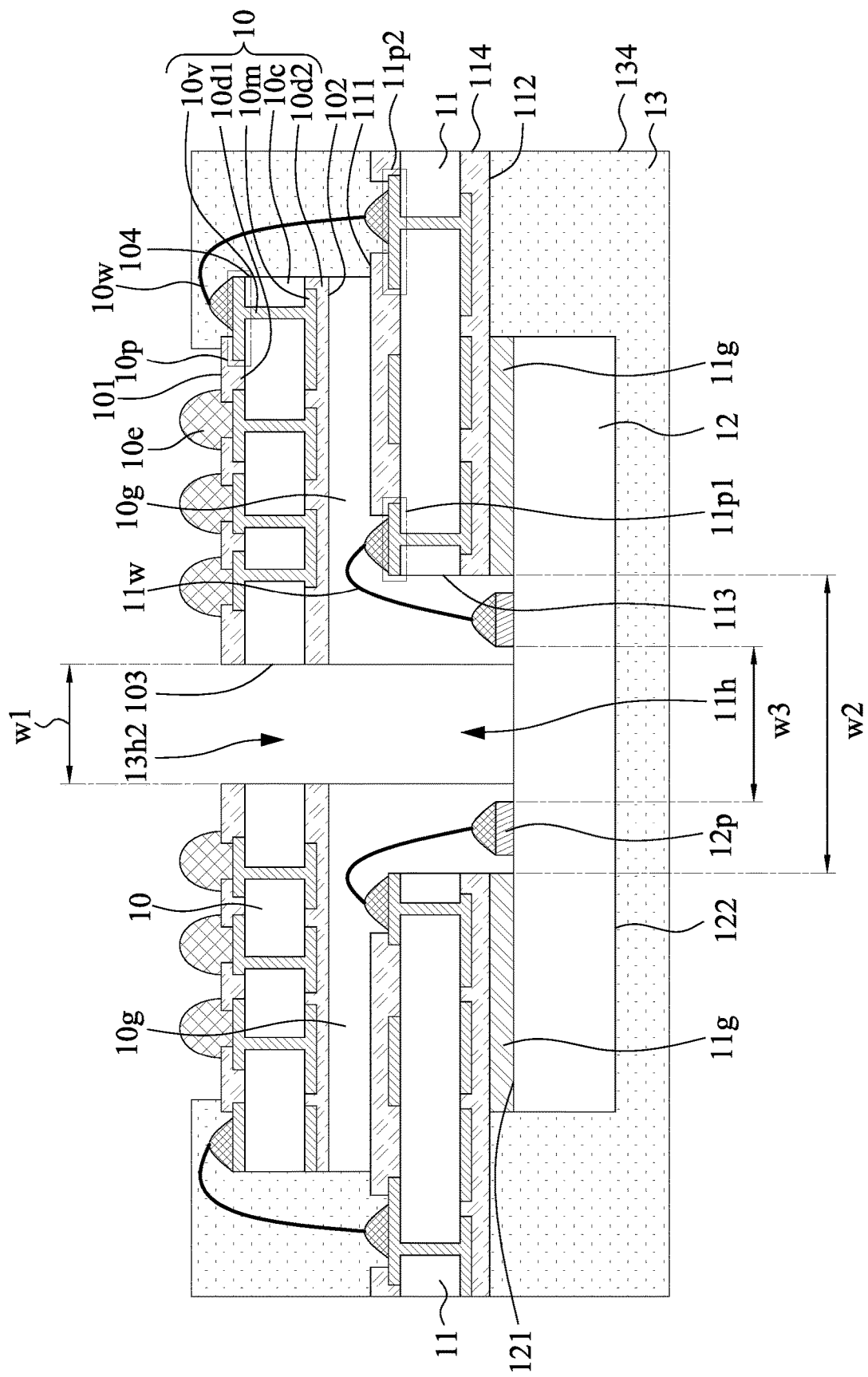
FIG. 2J illustrates one or more stages of a method of manufacturing a WBGA package in accordance with some embodiments of the present disclosure.

Referring to FIG. 2J, a part of the package body 13 may be removed to form an opening 13h2 to expose a testing area (and test pads thereon) of the electronic component 12. The opening 13h2 may expose the through hole 11h. The opening 13h2 may be aligned with the through hole 10h of the substrate 10 in FIG. 2I. The opening 13h2 may be formed by removing a part of the package body 13 in the through hole 10h of the substrate 10 in FIG. 2I. Then, a part of the package body 13 surrounded by the adhesive layer 10g may be removed.

Probe test operations may be performed through the opening 13h2 (or via the through hole 11h) to electrify the test pads on the electronic component 12 using probing needles to evaluate the electrical performance thereof and conduct a failure analysis.

Figure 3:
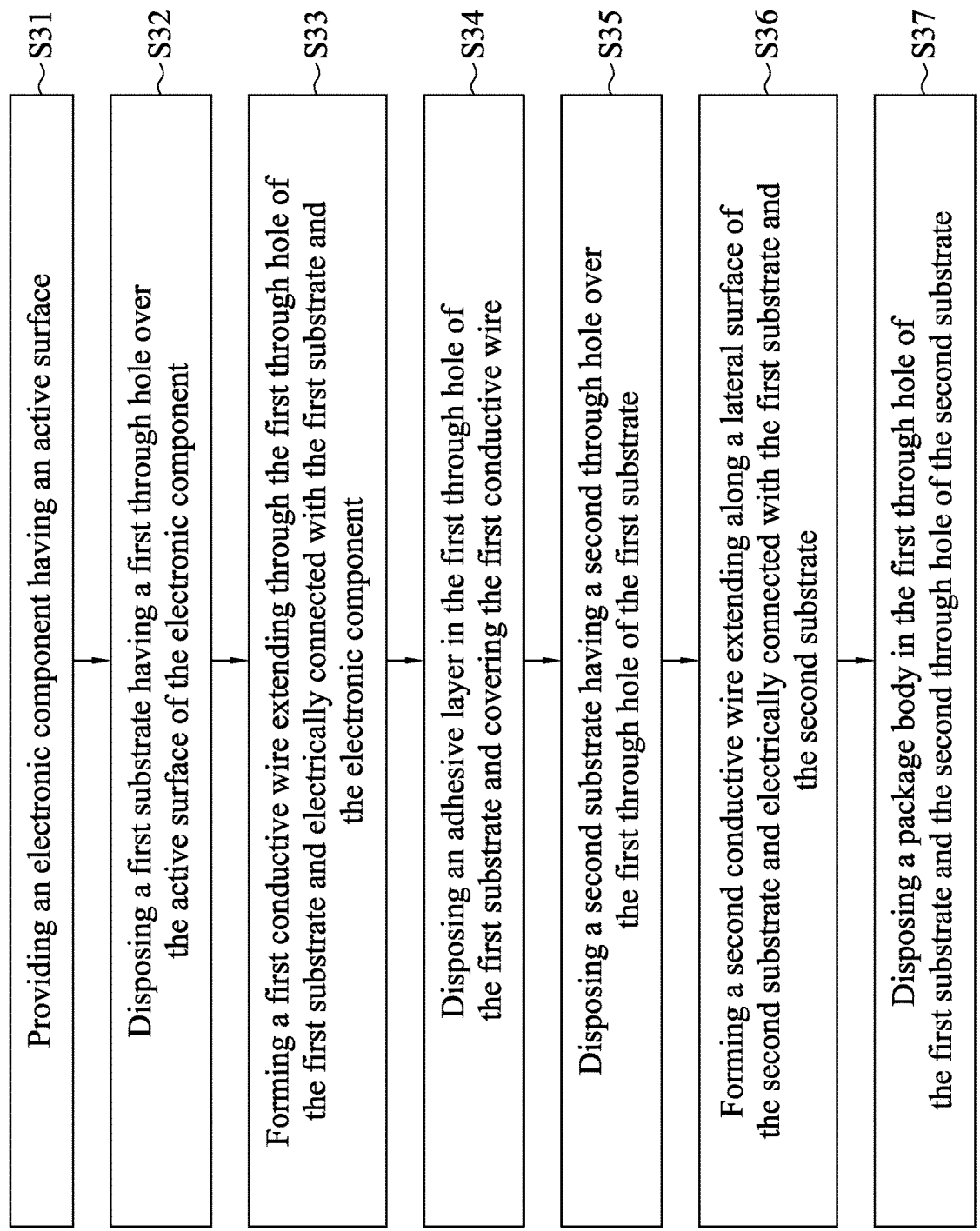
FIG. 3 illustrates a flow chart of a method of manufacturing a WBGA package in accordance with some embodiments of the present disclosure.

FIG. 3 illustrates a flow chart of a method 30 of manufacturing a WBGA package in accordance with some embodiments of the present disclosure.

The step or operation S31 is providing an electronic component having an active surface. For example, as shown in FIG. 2A, an electronic component 12 having a surface 121 is provided.

The step or operation S32 is disposing a first substrate having a first through hole over the active surface of the electronic component. For example, as shown in FIG. 2C, a substrate 11 is disposed over the surface 121 of the electronic component 12. The substrate 11 may include or define a through hole 11h.

The step or operation S33 is forming a first conductive wire extending through the first through hole of the first substrate and electrically connected with the first substrate and the electronic component. For example, as shown in FIG. 2D, the conductive pad 11p1 and the conductive pad 12p are electrically connected through a conductive wire 11w. The conductive wire 11w may extend through the through hole 11h.

The step or operation S34 is disposing an adhesive layer in the first through hole of the first substrate and covering the first conductive wire. For example, as shown in FIG. 2E, an adhesive layer 10g is disposed in the through hole 11h. The adhesive layer 10g may encapsulate or cover the conductive wire 11w.

The step or operation S35 is disposing a second substrate having a second through hole over the first through hole of the first substrate. For example, as shown in FIG. 2F, a substrate 10 is disposed over the surface 111 of the substrate 11. The substrate 10 may include or define a through hole 10h penetrating or traversing through the substrate 10. The through hole 10h may be at least partially overlapped with the through hole 11h.

The step or operation S36 is forming a second conductive wire extending along a lateral surface of the second substrate and electrically connected with the first substrate and the second substrate. For example, as shown in FIG. 2G, the conductive pad 11p2 and the conductive pad are electrically connected through a conductive wire 10w. The conductive wire 10w may extend along the lateral surface 104 of the substrate 10.

The step or operation S37 is disposing a package body in the first through hole of the first substrate and the second through hole of the second substrate. For example, as shown in FIG. 2H, a package body 13 is disposed in the through hole 10h and the through hole 11h.

One aspect of the present disclosure provides a WBGA package. The WBGA package includes a first substrate having a first through hole and a second substrate having a second through hole over the first through hole of the first substrate. The WBGA package also includes an electronic component having an active surface over the second through hole of the second substrate.

Another aspect of the present disclosure provides a WBGA package. The WBGA package includes a first substrate having a first through hole and a second substrate having a second through hole over the first through hole of the first substrate. The WBGA package also includes a package body disposed in the first through hole of the first substrate and the second through hole of the second substrate. The package body is spaced apart from a sidewall of the second through hole of the second substrate.

Another aspect of the present disclosure provides a method of manufacturing a WBGA package. The method includes providing an electronic component having an active surface and disposing a first substrate having a first through hole over the active surface of the electronic component. The method also includes disposing a second substrate having a second through hole over the first through hole of the first substrate.

According to some embodiments of the present disclosure, a substrate (such as an intermediate substrate) is utilized to electrically connect an electronic component, which is originally designed for flip-chip bonding, with a WBGA substrate through wire bonding. Therefore, the electronic component can be encapsulated in a wire bonding WBGA package without redesigning the routing and the pad pitches thereof to adapt to the wire bonding WBGA package. The routing and the pad pitches of the circuitry of the electronic component can be more flexible.

In addition, the substrate can have a through hole (or a window) exposing a testing area, which may include a plurality of test pads. Probe test operations may be performed via the through hole to electrify the test pads on the electronic component using probing needles to evaluate the electrical performance thereof and conduct a failure analysis.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A WBGA package, comprising:
a first substrate having an inner lateral surface and defining a first through hole within the inner lateral surface, wherein the lateral surface of the first substrate forms a sidewall of the first through hole;
a second substrate having an inner lateral surfaces and defining a second through hole within the inner lateral surface and over the first through hole of the first substrate, wherein the lateral surface of the second substrate forms a sidewall of the second through hole;
a package body having an outer portion formed on the second substrate and an inner portion disposed in the first through hole of the first substrate and the second through hole of the second substrate, wherein the inner portion of the package body is extended through the second through hole of the second substrate at a position that a lateral surface of the inner portion of the package body is spaced apart from the sidewall of the second through hole of the second substrate;
a first conductive wire extending along an outer lateral surface of the first substrate and electrically connected with the first substrate and the second substrate; and
a second conductive wire extending through the second through hole of the second substrate between the lateral surface of the inner portion of the package body and the sidewall of the second through hole of the second substrate;
wherein the package body covers the first conductive wire.

2. The WBGA package of claim 1, wherein an outer lateral surface of the outer portion of the package body and a lateral surface of the second substrate are substantially coplanar.

3. The WBGA package of claim 2, wherein the outer lateral surface of the outer portion of the second substrate is opposite to the sidewall of the second through hole of the second substrate.

4. The WBGA package of claim 1, wherein the inner portion of the package body contacts the sidewall of the first through hole of the first substrate.

5. The WBGA package of claim 4, wherein the outer portion of the package body contacts the outer lateral surface of the first substrate opposite to the sidewall of the first through hole of the first substrate.

6. The WBGA package of claim 1, further comprising:
a first adhesive layer disposed between the first substrate and the second substrate and covering the second conductive wire.

7. The WBGA package of claim 6, wherein the first adhesive layer contacts the sidewall of the second through hole of the second substrate.

8. The WBGA package of claim 6, further comprising:
a second adhesive layer disposed over the second substrate, wherein the first adhesive layer extends through the second through hole of the second substrate to contact the second adhesive layer.

9. A method of manufacturing a WBGA package, comprising:
providing an electronic component having an active surface;
disposing a first substrate having a first through hole over the active surface of the electronic component, wherein the first substrates further has an inner lateral surface defining the first through hole within the inner lateral surface;
disposing a second substrate having a second through hole over the first through hole of the first substrate, wherein the second substrates further has an inner lateral surface defining the second through hole within the inner lateral surface;
forming a package body by:
disposing an inner portion of the package body in the first through hole of the first substrate and the second through hole of the second substrate, wherein a lateral surface of the inner portion of the package body is spaced apart from the inner lateral surface of the second substrate; and
disposing an outer portion of the package on the second substrate; and
forming a first conductive wire extending through the first through hole of the first substrate and electrically connected with the first substrate and the electronic component and extending between the lateral surface of the inner portion of the package body and the inner lateral surface of the second substrate.

10. The method of claim 9, further comprising:
disposing an adhesive layer in the first through hole of the first substrate and covering the first conductive wire.

11. The method of claim 9, further comprising:
forming a second conductive wire extending along a lateral surface of the second substrate and electrically connected with the first substrate and the second substrate.

12. The method of claim 9, wherein a width of the inner portion of the package body is less than a width of the second through hole of the second substrate.

13. The method of claim 12, further comprising:
forming an opening in the package body to expose the active surface of the electronic component.

* * * * *